US010401392B2

United States Patent
Makinson et al.

(10) Patent No.: US 10,401,392 B2
(45) Date of Patent: Sep. 3, 2019

(54) SHUNT THERMOCOUPLE

(71) Applicant: Itron, Inc., Liberty Lake, WA (US)

(72) Inventors: David Nelson Makinson, Seneca, SC (US); Steven Grey, Seneca, SC (US)

(73) Assignee: Itron, Inc., Liberty Lake, WA (US)

( * ) Notice: Subject to any disclaimer, the term of this patent is extended or adjusted under 35 U.S.C. 154(b) by 295 days.

(21) Appl. No.: 15/386,412

(22) Filed: Dec. 21, 2016

(65) Prior Publication Data

US 2018/0172737 A1 Jun. 21, 2018

(51) Int. Cl.
| | |
|---|---|
| *G01R 15/14* | (2006.01) |
| *G01K 7/02* | (2006.01) |
| *G01K 1/02* | (2006.01) |
| *G01R 1/20* | (2006.01) |
| *G01K 7/08* | (2006.01) |
| *G01R 19/32* | (2006.01) |
| *G01R 22/06* | (2006.01) |

(52) U.S. Cl.
CPC .......... *G01R 15/146* (2013.01); *G01K 1/024* (2013.01); *G01K 7/02* (2013.01); *G01K 7/08* (2013.01); *G01R 1/203* (2013.01); *G01R 19/32* (2013.01); *G01R 22/061* (2013.01)

(58) Field of Classification Search
CPC ........ G01R 1/44; G01R 11/185; G01R 19/32; G01R 21/14; G01R 1/0458; G01R 31/2872; G01R 31/2881; G01R 15/146; G01R 1/203; G01R 22/061; G01K 1/024; G01K 7/02; G01K 7/08
USPC ................................. 324/105, 106
See application file for complete search history.

(56) References Cited

U.S. PATENT DOCUMENTS

| | | | | |
|---|---|---|---|---|
| 3,059,182 A | | 10/1962 | Smith | |
| 3,447,082 A | * | 5/1969 | Calderhead | G01R 5/22 324/106 |
| 8,395,464 B2 | * | 3/2013 | Pontin | G01R 1/04 200/239 |
| 2008/0095075 A1 | | 4/2008 | Monier | |

(Continued)

FOREIGN PATENT DOCUMENTS

| | | |
|---|---|---|
| CN | 201060231 | 5/2008 |
| DE | 69400014 | 5/1996 |

(Continued)

OTHER PUBLICATIONS

PCT Search Report and Written Opinion dated Mar. 28, 2018 for PCT Application No. PCT/US2017/67292, 11 pages.

(Continued)

*Primary Examiner* — Tung X Nguyen
*Assistant Examiner* — Robert P Alejnikov, Jr.
(74) *Attorney, Agent, or Firm* — Lee & Hayes, P.C.

(57) ABSTRACT

A thermocouple device includes a shared conductor for a shunt measurement and a thermocouple measurement. For example, the thermocouple device may include a shared conductor that provides a signal to both calculate current of a shunt and calculate a temperature of the shunt. The thermocouple device may provide an efficient structure that accurately calculates current and temperature. In addition, the thermocouple device may use the temperature of the shunt to detect when a conductive path is overheating. The temperature of the shunt may also be used for other purposes.

20 Claims, 11 Drawing Sheets

(56) References Cited

U.S. PATENT DOCUMENTS

| | | | | |
|---|---|---|---|---|
| 2013/0328547 | A1* | 12/2013 | Marten | G01R 1/203 |
| | | | | 324/126 |
| 2014/0260334 | A1* | 9/2014 | Savelli | H01L 35/06 |
| | | | | 62/3.7 |
| 2015/0070021 | A1 | 3/2015 | Dulle et al. | |
| 2015/0377949 | A1* | 12/2015 | Ramirez | G01R 22/068 |
| | | | | 361/103 |
| 2018/0100877 | A1 | 4/2018 | Nakamura et al. | |
| 2018/0172736 | A1 | 6/2018 | Makinson | |

FOREIGN PATENT DOCUMENTS

| | | | | |
|---|---|---|---|---|
| EP | 0772050 | | 5/1997 | |
| EP | 0772050 B1 * | | 4/2003 | H01H 1/26 |
| EP | 2169410 | | 3/2010 | |
| WO | WO2013093714 | | 6/2013 | |
| WO | WO02016175115 | | 11/2016 | |

OTHER PUBLICATIONS

PCT Search Report and Written Opinion dated Mar. 2, 2018 for PCT application No. PCT/US2017/067273, 12 pages.

Non Final Office Action dated Dec. 13, 2018 for U.S. Appl. No. 15/386,376 "Multi-Piece Current Shunt With Conductive Channel for Uniform Current Flow" Makinson, 13 pages.

* cited by examiner

SHUNT THERMOCOUPLE

BACKGROUND

Shunts are used in various industries to measure current. For example, in the utility context, a shunt may be placed in a meter to measure current that is consumed at a facility where the meter is located. The shunt is often a single piece of copper or another material. In particular, the shunt may be a uniform piece of copper that forms a U-shape, with the ends of the shunt being connected to a socket at the facility. Due to the U-shape of the shunt, current flow through the shunt is non-uniform (e.g., current flow lines of equipotential are not uniform at the corners). This leads to inaccurate current measurements. Furthermore, temperature changes at the shunt affect the resistance of the shunt, which further decreases the accuracy of the current measurements. As such, shunts have been used in low accuracy implementations that are associated with relatively few Amperes. For example, shunts are used in meter implementations that reach a maximum of 100 Amperes and that provide a relatively broad tolerance of error in current measurements.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
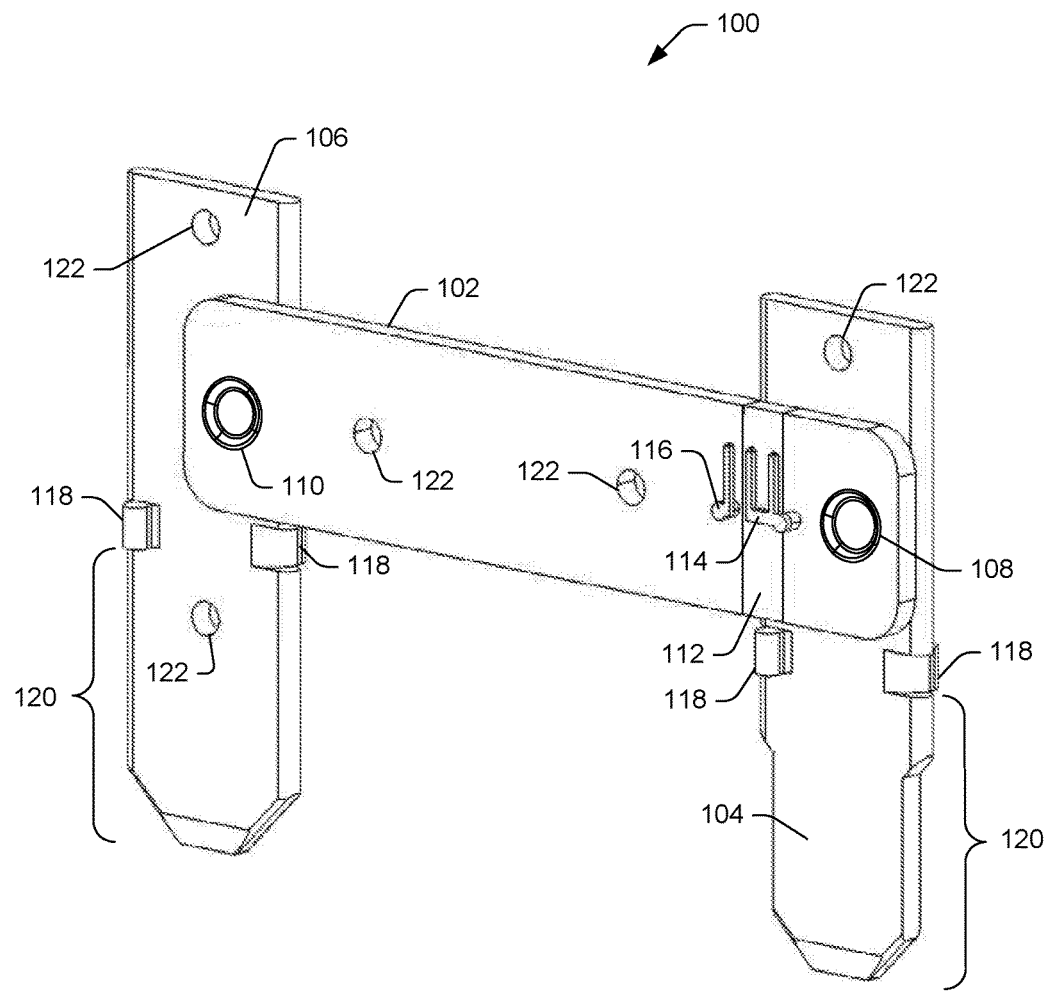
FIG. 1 illustrates an example shunt having at least one conductive channel that provides a uniform flow of current.

This disclosure describes a shunt that is composed of multiple pieces with at least some of the pieces being connected by a conductive channel that provides uniform flow of current. The conductive channel may be a recess, raised portion, stand-alone component, or other channel that directs current to flow from one piece of the shunt to another piece in a uniform manner, resulting in an accurate current reading for the shunt. Further, the shunt may include multiple pieces that are composed of different materials, which may vary in price. By doing so, a cost of the shunt may be minimized.

In some examples, a shunt includes a shunt bus disposed between two or more terminals that are adapted to connect to a conductive path. For example, the conductive path may include a meter socket located at a facility where electricity consumption is monitored. Here, the shunt may form at least part of the conductive path to allow current to flow from one jaw of the meter socket that is connected to a first terminal, through the shunt bus and to the other jaw of the meter socket that is connected to the second terminal. The shunt bus may be electrically connected to a first terminal of the shunt via a protrusion (e.g., a raised portion) that is located on the shut bus or the first terminal, or may be provided as a separate component. In some instances, the protrusion may be elliptical in shape (e.g., a circle, oval, etc.). In other instances, the protrusion may have other shapes, such as a rectangle, triangle, etc. The shunt bus may also be electrically connected to a second terminal of the shunt, either directly or through another component, such as a switch.

To provide a current reading, the shunt may include a shunt element disposed along the shunt bus between the first and second terminals. In some instances, the shunt element is offset toward one side of the shunt (e.g., the first or second terminal), while in other instances the shunt element is located elsewhere along the shunt bus. The shunt element comprises a resistive element that provides a voltage drop. Such voltage drop may be measured and used to derive an amount of current flowing through the shunt.

Although the above example describes a shunt with a protrusion between the first terminal and the shunt bus, a protrusion may additionally, or alternatively, be provided between other components of the shut. For example, a protrusion may be located between the shunt bus and the second terminal, between the shunt bus and a connecting element that acts as an intermediate component between the shunt bus and the second terminal, and/or between other components of the shunt.

The shunt described herein may provide uniform current flow, resulting in an accurate measurement of current through the shunt. For example, a protrusion that connects a first terminal to a shunt bus may provide a single connection point for current to uniformly flow from the first terminal to the shunt bus where the shunt element is located. This may result in current flow lines of equipotential being more uniform near the shunt element, in comparison to previous U-shaped shunts that provide non-uniform current flow at the corners and the shunt element. Thus, a more accurate voltage reading for the shunt element may be made and, consequently, a more accurate current measurement. Further, the protrusion may be particularly useful in implementations where the shunt element is offset toward a terminal (e.g., due to other components being positioned between the first and second terminals). In such implementations, the protrusion may allow current to flow uniformly through the shunt element, even though the shunt element is located within proximity (e.g., predetermined distance) to a connection point to a terminal.

In addition, by using a shunt that includes multiple pieces, a cost of producing the shunt may be minimized. For example, the shunt may be made of a shunt bus that is composed of a first material and terminals that are composed of a different material, such as a less expensive (or more expensive) material. This may reduce costs of producing the shunt, in comparison to previous shunts that are composed of a single piece of material.

This disclosure also describes a thermocouple device that includes a shared conductor for a shunt measurement and a thermocouple measurement. In many instances, a calculation of an amount of current through a shunt may be affected by the temperature of the shunt, which may be due to meter load, ambient temperature, and so on. Thus, the temperature of the shunt may be measured to compensate for inaccuracies of the current calculation. The thermocouple device described herein may include a shared conductor that provides a signal to both calculate current of a shunt and calculate a temperature of the shunt. The thermocouple device may provide an efficient structure that accurately calculates current and temperature. In addition, the thermocouple device may use the temperature of the shunt to detect a "hot socket" condition where a conductive path, such as a socket, is overheating. The temperature of the shunt may also be used for other purposes.

In some examples, a thermocouple device includes a reference conductor connected to a first side of a shunt, a sensing conductor connected to a second side of the shunt, and a thermocouple conductor connected to the first side of the shunt. The reference conductor and the thermocouple conductor may create a thermocouple to measure temperature of the shunt, while the reference conductor and the sensing conductor may be used to measure current through the shunt. In particular, the reference conductor, the sensing conductor, and the thermocouple conductor may be connected to one or more hardware components, such as one or more processors, Application-specific Integrated Circuits (ASICs), and so on. The one or more hardware components may determine a temperature of the shunt based on a signal from the reference conductor and a signal from the thermocouple conductor. Further, the one or more hardware components may determine an amount of current passing through the shunt based on the signal from the reference conductor and a signal from the sensing conductor. The one or more hardware components may also use the temperature of the shunt to determine the amount of current. That is, the temperature of the shunt may be used to adjust a current measurement for the shunt, thereby leading to an accurate current measurement for the shunt.

In some examples, the thermocouple device may use the temperature of the shunt to determine a condition referred to as a "hot socket." In some instances, a socket that is connected to a shunt may overheat, due to a loose connection between the socket and the shunt, a short circuit, and so on. As such, the thermocouple device described herein may determine the temperature of the shunt and use the temperature to determine when a "hot socket" is occurring at the socket. In particular, the one or more hardware components of the thermocouple device may detect that a temperature of the shunt is greater than a threshold. Based on the detection, the one or more hardware components may send an alert indicating the "hot socket" condition. For example, the alert may be sent to a service provider computing device associated with a utility (e.g., a central office of the utility), a computing device associated with a technician performing maintenance on the thermocouple device, a computing device associated with a customer, and so on. The alert may allow the party or entity to remove the shunt from the socket, stop current flow through the shunt, stop current flow through the socket, and/or perform a variety of other operations. This may avoid the socket, shunt, meter, and/or other components from being damaged (e.g., melting, igniting, etc.).

The thermocouple device described herein may provide an efficient structure that accurately calculates current and temperature of a shunt. For example, the thermocouple device may include a shared conductor for a shunt measurement and a thermocouple measurement. This may minimize costs for producing a structure that compensates for temperature of the shunt. In addition, by using a structure that is connected directly to the shunt to determine a temperature of the shunt, an accurate temperature reading may be made. Further, by obtaining a temperature reading for a component that is connected to a socket (i.e., the shunt), a "hot socket" condition may be more accurately and quickly detected, in comparison to previous techniques that used a temperature reading at another location farther from the socket. This may ultimately avoid damage to the socket, shunt, meter, and/or other components.

FIG. 1 illustrates an example shunt 100 having at least one conductive channel that provides a uniform flow of current. In particular, the shunt 100 includes a shunt bus 102 electrically connected to a first terminal 104 at a first end of the shunt bus 102 and electrically connected to a second terminal 106 at a second end of the shunt bus 102. The first and second terminals 104 and 106 may be adapted to electrically connect to a conductive path, such as an electrical socket (e.g., receptacle). For instance, the first and second terminals 104 and 106 may connect to jaws of a meter socket that is located at a residence. The meter socket may form a conductive path at the residence. In this example, the shunt bus 102 includes protrusions 108 and 110 that extend from the shunt bus 102. The protrusions 108 and 110 may be electrically connected to the first and second terminals 104 and 106, respectively. The shunt bus 102 also includes a shunt element 112 disposed between the protrusions 108 and 110. Further, the shunt bus 102 includes a connection point 114 positioned on one side of the shunt element 112 and a connection point 116 positioned on the other side of the shunt element 112. The connection points 114 and 116 connect to conductors (not illustrated in FIG. 1) to measure current passing through the shunt element 112 and/or a temperature of the shunt 100. Example connection points are discussed in further detail below in reference to FIGS. 4 and 5.

In the example of FIG. 1, the shunt bus 102, the first terminal 104, and/or the second terminal 106 are elongated members. An elongated member may have a length that is longer than a width (in some instances, by more than a particular amount). The shunt bus 102 may substantially perpendicular to the first terminal 104 and/or the second terminal 106. Substantially perpendicular may refer to the components having between a 45-degree angle and a 135-degree angle with respect to each other. In some instances, the components may form a 90-degree angle with respect to each other with plus or minus 5 degrees. Although in other instances, the shunt bus 102 may not be substantially perpendicular to the first terminal 104 and/or the second terminal 106.

In the example of FIG. 1, the shunt bus 102 is offset closer to the first terminal 104 than the second terminal 106. That is, the shunt bus 102 is connected to the first terminal 104 closer to a right side of the first terminal 104, and is connected to the second terminal 106 closer to the right side of the second terminal 106 (e.g., a side of the second terminal 106 that is closest to the first terminal 104). This may allow other components to be connected to the shunt bus 102 (as discussed below in reference to FIG. 6) and/or other components to be provided between the first and second terminals 104 and 106. Further, the offset may conserve material of the shunt bus 102 (at least with respect to the left side of the shunt bus 102, since it does not extend as far over the second terminal 106). When the shunt bus 102 is offset to the right, the shunt element 112 may be positioned above the left side of the first terminal 104. Although in other examples, the shunt bus 102 may be centered, offset to the left, or otherwise positioned.

In many examples, the shunt bus 102 is composed of a different material than the first terminal 104 and/or the second terminal 106. In one illustration, the first and second terminals 104 and 106 are composed of nearly 100% copper (Cu) (e.g., 98-100% copper), and are also tin (Sn) plated. The shunt bus 102 may include a first portion composed of copper (e.g., a portion of the shunt bus 102 to the left of the shunt element 112 in FIG. 1), the shunt element 112 composed of a different material than the rest of the shunt bus 102 (as discussed below), and a second portion composed of copper (e.g., a portion of the shunt bus 102 to the right of the shunt element 112 in FIG. 1). This composition for the shunt bus 102 tends to be more expensive (3-4 times) to manufacture than basic Cu, due to the process cost of joining the shunt element 112 to the shunt bus 102 (e.g., typically Electron Beam welding). In some instances, the first and second terminals 104 and 106 are tin plated to meet certain standards as well as certain design criteria, but the shunt bus 102 and/or the shunt element 112 are not tin plated. In previous techniques, a shunt manufacturing process included constructing the entire part of a "sandwich" feedstock (e.g., manufactured copper composition), and then selectively plating terminal sections with tin. This added a plating process in a non-ideal sequence of manufacture. Further, in some instances if tin is placed on a shunt bus or a shunt element, this may short or change the resistance of the shunt element (e.g., cause undesirable results). In many instances, by using multiple pieces (that may be composed of different types of materials), the techniques of this disclosure allow a shunt to be manufactured in a more efficient manner, which may reduce costs.

In other illustrations, the shunt bus 102, the first terminal 104, and/or the second terminal 106 may be composed of other types of materials or the same material. The shunt bus 102, the first terminal 104, and/or the second terminal 106 may be composed of any type of electrically conductive material. In many instances, the shunt bus 102 may be composed of a material that is more expensive than a material of the first terminal 104 and/or the second terminal 106. Although in other illustrations, such relationship may be swapped. Further, in other illustrations the shunt bus 102, the first terminal 104, and/or the second terminal 106 may be composed of other types of conductive material, such as other metals (e.g., aluminum, alloy, etc.).

As discussed above, the shunt bus 102 may include the shunt element 112. The shunt element 112 may be a resistive element to provide a voltage drop across the shunt element 112 when the shunt 100 is connected to an electricity source. For instance, when the first and second terminals 104 and 106 are connected to a meter socket at a facility, such as a customer's residence, current may flow through the shunt 100 and voltage may drop across the shunt element 112, due to the resistive properties of the shunt element 112. Since the resistance of the shunt element 112 is known, and the voltage drop across the shunt element 112 may be measured, the current flowing through the shunt element 112 may be calculated according to Ohm's law. In the example of FIG. 1, current may enter through the first terminal 104, pass through the protrusion 108 to the shunt bus 102, pass from the shunt bus 102 to the second terminal 106 through the protrusion 110, and exit through the second terminal 106. As such, the first terminal 104, the protrusion 108, the shunt bus 102, the protrusion 110, and the second terminal 106 may form a conductive path from a first jaw of the meter socket to a second jaw of the meter socket, for example. The shunt element 112 may be formed of any material. In many instances, the shunt element 112 is composed of a material that is more resistive than a material of the shunt bus 102 (e.g., 40 times more resistive than the copper of the shunt bus 102). In one example, the shunt element 112 is composed of Manganin®. In another example, the shunt element 112 is composed of constantan or nichrome. In other examples, other types of materials are used.

The shunt element 112 may be positioned anywhere along the shunt bus 102. In some instances, the shunt element 112 is offset toward one side of the shunt bus 102. In the example of FIG. 1, the shunt bus is positioned closer to the first terminal 104 (and the protrusion 108) than the second terminal 106. This may allow other components to be connected to the shunt bus 102 (as discussed below in reference to FIG. 6) and/or other components to be provided between the first and second terminals 104 and 106. In the example of FIG. 1, the shunt element is positioned over the first terminal 104 (e.g., above the first terminal 104). In other examples, the shunt element 112 is positioned elsewhere, such as in the middle of the shunt bus 102 or offset toward the second terminal 106.

The protrusions 108 and 110 provide conductive channels for current to flow, as noted above. The protrusions 108 and 110 may generally create distance between the respective terminal and protrusion, so that current flows through the protrusion. This distance is illustrated in further detail in FIGS. 2 and 3. The protrusions 108 and 110 may provide connection points from the shunt bus 102 to the terminals 104 and 106, respectively. For example, the protrusion 108 may provide a single connection point between the first terminal 104 and the shunt bus 102 (e.g., the protrusion 108 may be the only connection point between those two components).

FIG. 1 shows the indentation side of the protrusions 108 and 110 (i.e., a front side of the shunt 100). That is, the protrusions 108 and 110 extend from the shunt bus 102 on a back side of the shunt bus 102, as illustrated in FIG. 2. In FIG. 1, the protrusions 108 and 110 appear as recesses (e.g., dimples), since the front side of the shunt 100 is shown. Thus, depending on the perspective of view, the protrusions 108 and 110 may also be referred to as recesses, raised portions, or more generally conductive channels. Further, as discussed in other examples herein, the protrusions 108 and/or 110 may alternatively, or additionally, be provided on the first and second terminals 104 and/or 106, as stand-alone components, and/or as part of a different component.

The protrusions 108 and 110 (as well as any other conductive channels discussed herein) may take on various forms. In the example of FIG. 1, the protrusions 108 and 110 are circular (i.e., circles). However, the protrusions 108 and 110 may be ovals, rectangles, triangles, squares, trapezoids, or any other shape. The protrusions 108 and 110 may take on the same form (e.g., shape, height, width, depth, etc.) or different forms. The protrusions 108 and 110 may be formed by stamping, embossing, carving, casting, molding, punching, and so on. The protrusions 108 and 110 may be formed in the same manner or different manners.

As illustrated in FIG. 1, the shunt 100 may also include other components. For instances, the shunt 100 may include tabs 118 to attach to components of a meter or another device in which the shunt 100 is implemented. Additionally, or alternatively, the tabs 118 may facilitate connection to a socket, such as a meter socket. Further, the tabs 118 may be used for positioning the shunt 100 in the meter itself. Sections 120 of the shunt 100 illustrate the portions of the first and second terminals 104 and 106 that are inserted into a socket. The first and second terminals 104 and 106 may be adapted to fit various forms of a socket. Further, the shunt 100 may include holes 122, which may be used for manufacturing the shunt 100, attaching the shunt 100 to a meter or another device, and so on. Other means may additionally, or alternatively, be used to determine the depth of terminal insertion into the socket jaws.

The components of the shunt 100 may be connected through various manners. For example, the components may be brazed, soldered, welded, glued (e.g., with a conductive glue), heated together, connected with an adhesive (e.g., a conductive adhesive), or otherwise joined together. In some instances, a conductive filler (e.g., a metal) is applied between components to make a connection, while in other instances the components may be directly attached to each other. To illustrate, the first terminal 104 may be brazed to the shunt bus 102 at the protrusion 108 with a filler metal being applied to the connection point (e.g., the protrusion 108).

The components of the shunt 100 may be directly or indirectly connected. The terms "connected" or "electrically connected" may refer to components directly contacting each other or indirectly contacting each other, such as through a conductive filler and/or an intermediary component (e.g., a switch, as shown in FIG. 6). In one example, if the first terminal 104 is brazed to the shunt bus 102 at the protrusion 108 with a filler metal applied between the components, the first terminal 104 may be referred to as being connected or electrically connected to the shunt bus 102. Here, an electrically conductive path is formed between the first terminal 104 and the shunt bus 102. In another example, the first terminal 104 may be connected to the shunt bus 102 via a spacer (e.g., a washer). Here, the first terminal 104 may maintain contact with the spacer and the shunt bus 102 may maintain contact with the spacer through a fastener (e.g., a rivet, screw, etc.) that holds the components together. In contrast, the phrases "directly connected" or "directly attached" may refer to components directly contacting to each other (e.g., without a metal filler and/or an intermediary component). For example, the first terminal 104 may, in some instances, be directedly attached to the shunt bus 102 through a fastener.

Figure 2A:
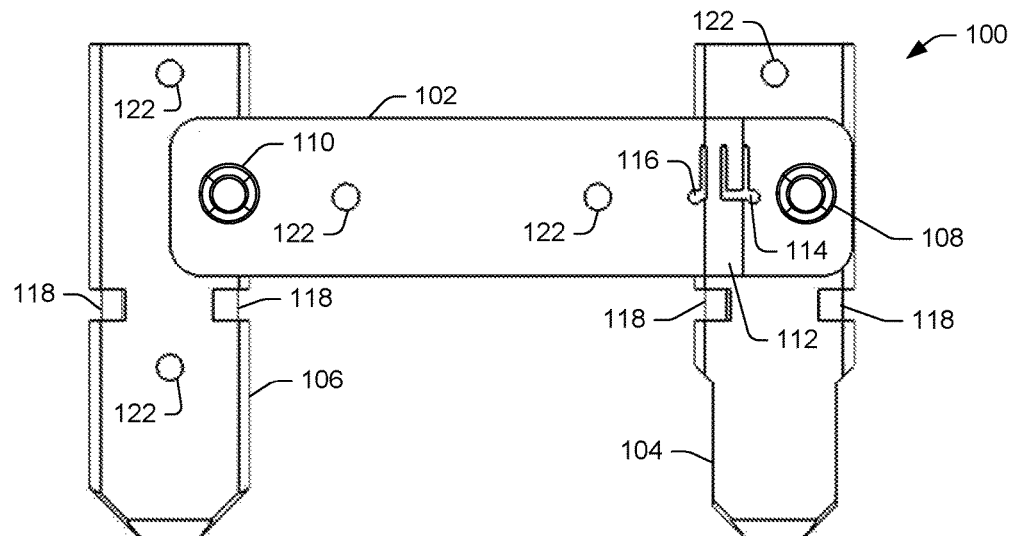
FIG. 2A illustrates a front view of the example shunt of FIG. 1.
Figure 2B:
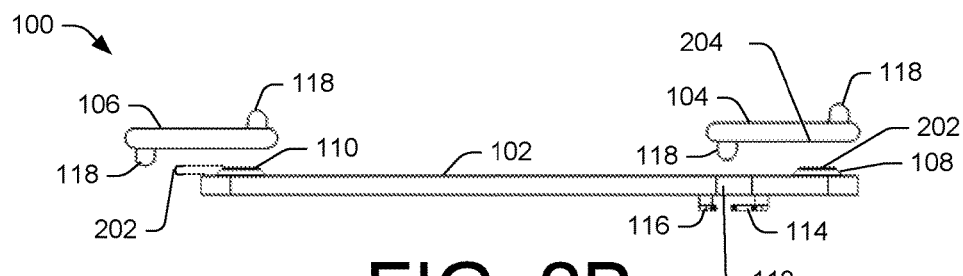
FIG. 2B illustrates a top view of the example shunt of FIG. 1.
Figure 2C:
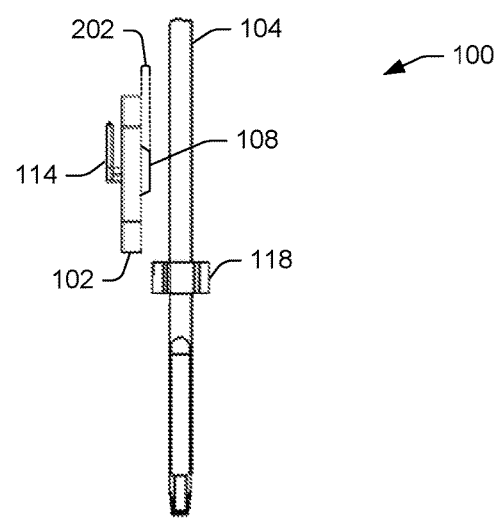
FIG. 2C illustrates a side view of the example shunt of FIG. 1.

FIGS. 2A, 2B, and 2C illustrate a front view, top view, and side view of the example shunt 100 of FIG. 1, respectively.

FIGS. 2B and 2C illustrate the shunt 100 in exploded views with the shunt bus 102 being detached from the first and second terminals 104 and 106. For example, as shown in FIG. 2B, a surface 202 of the protrusion 108 is removed from contacting a surface 204 of the first terminal 104. Other example shunts in connected forms are shown in FIGS. 6 and 7, as discussed below.

FIGS. 2B and 2C illustrate that the protrusions 108 and 110 extend off the back side of the shunt bus 102 a distance 202. The distance 202 may be a predetermined distance, in some examples. The distance 202 may be referred to as a depth of the protrusions 108 and 110. The distance 202 for the protrusions 108 and 110 may be the same or different. In other words, the protrusion 108 may extend off the back side of the shunt bus 102 and the protrusion 110 may extend off the back side of the shunt bus the same distance or different distances. As illustrated, the protrusions 108 and 110 create raised connection points (also referred to as conductive channels) for the shunt bus 102 to connect to the first and second terminals 104 and 106, respectively.

Figure 3A:
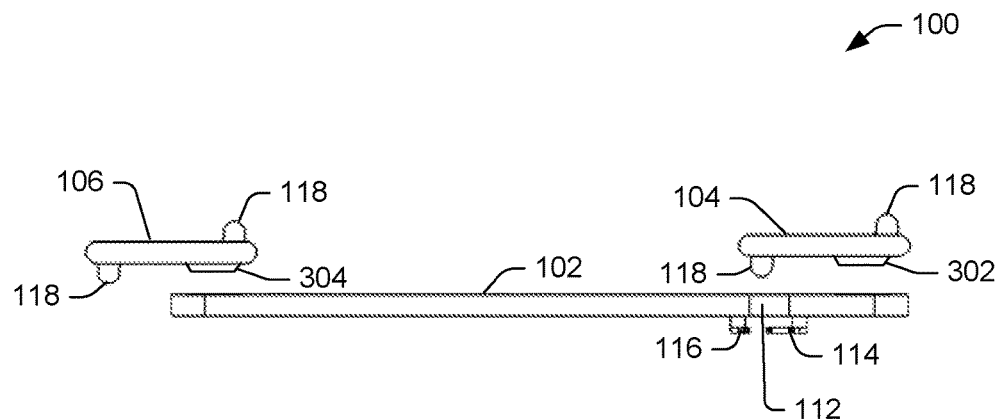
FIG. 3A illustrates an example shunt with protrusions that extend off terminals.

FIG. 3A illustrates the example shunt 100 with protrusions 302 and 304 that extend off the first and second terminals 104 and 106, respectively. FIG. 3A represents an exploded view, with the first and second terminals 104 and 106 being separated from the shunt bus 102. In this example, the protrusions 302 and 304 form the conductive channels to connect the first and second terminals 104 and 106 to the shunt bus 102, respectively. The protrusions 302 and 304 may be the same as the protrusions 108 and 110, except that the protrusions 302 and 304 are part of the first and second terminals 104 and 106, instead of part of the shunt bus 102. In this example, the protrusions 108 and 110 that extended off the shunt bus 102 (as illustrated in FIGS. 2B and 2C, for example) have been removed. Although in other examples the protrusions 108 and 110 may remain and attach to the protrusions 302 and 304, respectively.

Figure 3B:
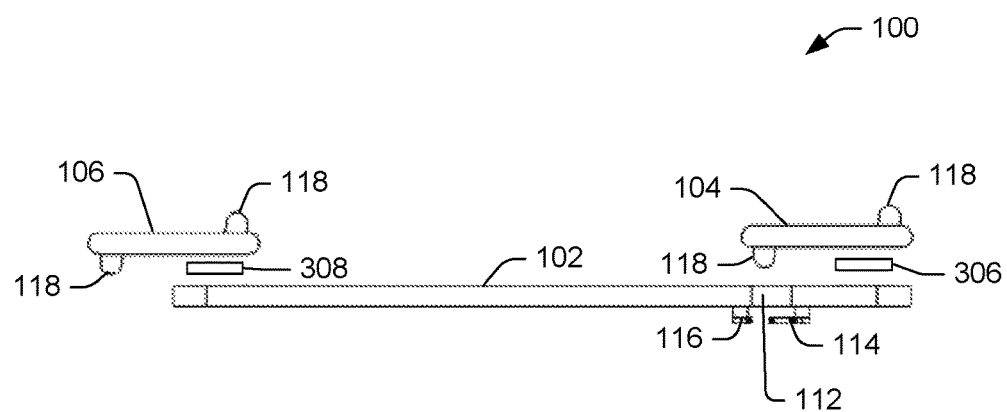
FIG. 3B illustrates an example shunt with stand-alone components that form conductive channels to a shunt bus.

FIG. 3B illustrates the example shunt 100 with stand-alone components 306 and 308 that form conductive channels to the shunt bus 102. FIG. 3B represents an exploded view, with the first and second terminals 104 and 106 being separated from the shunt bus 102 and the stand-alone components 306 and 308. The stand-alone components 306 and 308 may be formed of any type of conductive material. The stand-alone components 306 and 308 may be attached to the first and second terminals 104 and 106, respectively, and/or attached to the shunt bus 102 through various manners, such as brazing, soldering, welding, gluing (e.g., with a conductive glue), heating together, using an adhesive (e.g., a conductive adhesive), and so on.

The protrusions 302 and 304 and/or the stand-alone components 306 and 308 may take on various forms (e.g., shapes, heights, widths, depths, etc.), as similarly discussed above with respect to the protrusions 108 and 110. The protrusions 302 and 304 and/or the stand-alone components 306 and 308 may be formed by stamping, embossing, carving, casting, molding, punching, and so on. The protrusions 302 and 304 and/or the stand-alone components 306 and 308 may be formed in the same manner or different manners.

Figure 4A:
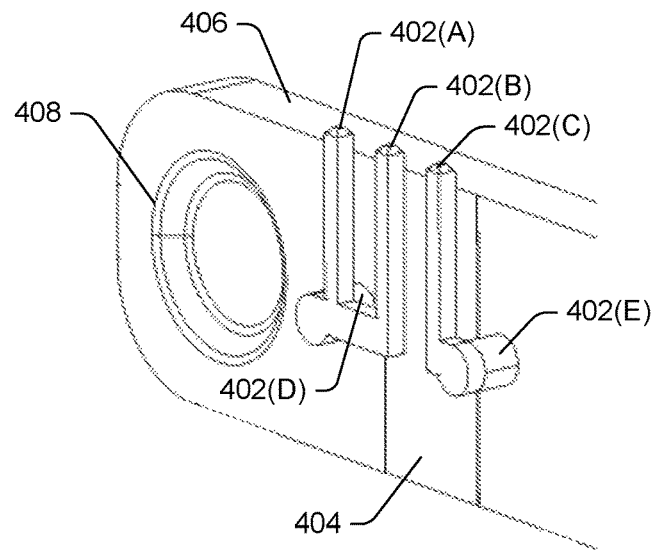
FIG. 4A illustrates example connection points that include pins and half-shear buttons.

FIG. 4A illustrates example connection points 402 that include pins 402(A)-402(C) and half-shear buttons 402(D) and 402(E). The pins 402(A)-402(C) may be collectively referred to as a pin assembly. In particular, the half-shear button 402(D) is positioned on a first side of the shunt element 404, while the half-shear button 402(E) is positioned on a second side of the shunt element 404. The half-shear button 402(D) may connect to pins 402(A) and 402(B), while the half-shear button 402(E) may connect to the pin 402(C). As such, the half-shear button 402(D) and the pins 402(A) and 402(B) may form a first connection point to the shunt bus 406, while the half-shear button 402(E) and the pin 402(C) may form a second connection point to the shunt bus 406.

The connection points 402 may connect to conductors (not illustrated in FIGS. 4A and 4B) to measure current passing through a shunt element 404 and/or a temperature of a shunt bus 406. The conductors may be wires, leads, conductive traces (e.g., Printed-Circuit Board (PCB) traces, etc.), bus bars, and so on. As discussed in further detail below, the pin 402(A) (or the pin 402(B)) may be connected to a reference conductor, the pin 402(B) (or the pin 402(A)) may be connected to a thermocouple conductor, and the pin 402(C) may be connected to a sensing conductor. As such, a signal from the reference conductor and a signal from the thermocouple conductor may be used to determine a temperature of the shunt bus 406, while a signal from the reference conductor and a signal from the sensing conductor may be used to determine current flowing through the shunt element 404.

As illustrated, the connection points 402 are positioned within proximity (e.g., a predetermined distance) to a conductive channel 408. In this example, the conductive channel 408 comprises a protrusion on the shunt bus 406. The half-shear button 402(D) is positioned closer to the conductive channel 408 than the half shear button 402(E). In this example, current may flow though the conductive channel 408 into the shunt bus 406 and then through the shunt element 404 (e.g., in a left-to-right manner with respect to FIGS. 4A and 4B). Although in other examples, the current may flow in the opposite direction.

As noted above, in the example of FIGS. 4A and 4B a path of current through the shunt element 404 is defined from left-to-right. This path corresponds to a first direction. Further, the half-shear button 402(D) and/or the half-shear button 402(E) are positioned in substantially a center of the shunt bus 406 in a second direction (e.g., a vertical axis) that is perpendicular to the first direction.

Figure 4B:
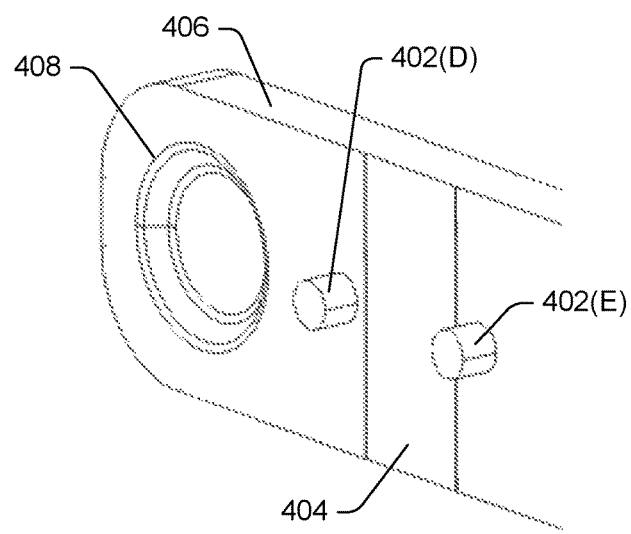
FIG. 4B illustrates example connection points with pins removed.

FIG. 4B illustrates the example connection points 402 with the pins 402(A)-402(C) removed. That is, FIG. 4B illustrates the half-shear buttons 402(D) and 402(E) without the pins 402(A)-402(C).

Although FIGS. 4A and 4B illustrate the connection points 402 positioned on the shunt bus 406, in other examples the connection points 402 may be positioned on the shunt element 404. For example, the half-shear buttons 402(D) and 402(E) may be located on the shunt element 404, such as on opposite sides of the shunt element 404.

Figure 5A:
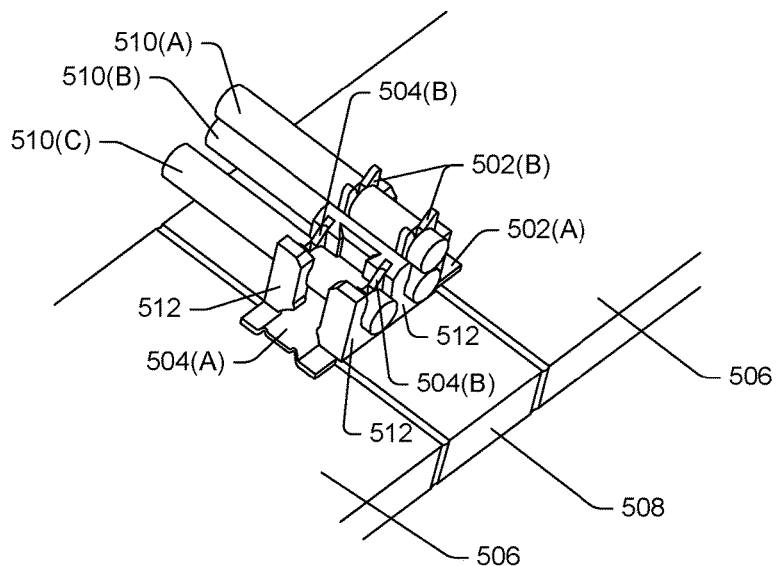
FIG. 5A illustrates example connection points with conductors.
Figure 5B:
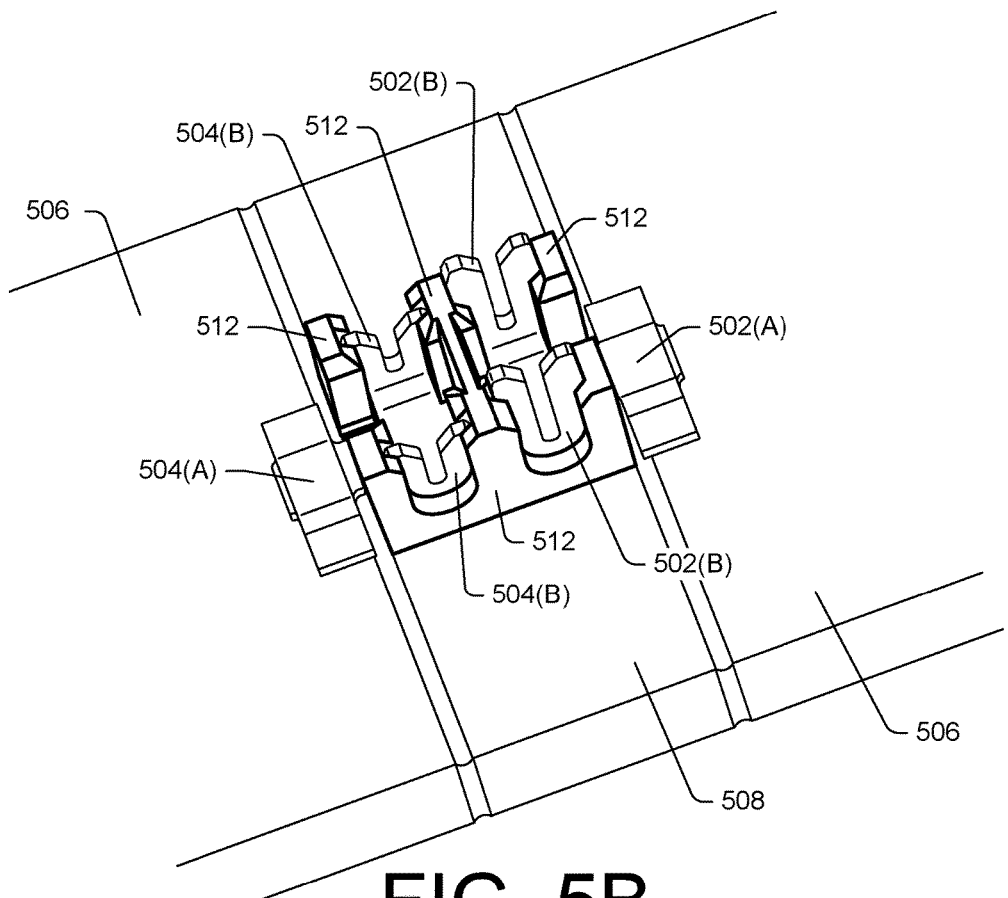
FIG. 5B illustrates example connection points without conductors.

FIGS. 5A and 5B illustrate example connection points 502 and 504 that represent insulation displacement connection. In this example, the connection points 502 and 504 may connect to a shunt bus 506 on different sides of a shunt element 508. The connection points 502 and 504 may be configured to receive conductors 510 (e.g., wires, leads, traces, etc.) to measure current passing through the shunt element 508 and/or a temperature of the shunt bus 506. In one example, the conductor 510(A) may comprise a thermocouple conductor, the conductor 510(B) may comprise a reference conductor, and the conductor 510(C) may comprise a sensing conductor. Although other arrangements of the conductors 510 may be implemented.

The connection point 502 may include a connecting member 502(A) connected to the shunt bus 506 and receiving members 502(B) configured to receive the conductors 510(A) and 510(B). Meanwhile, the connection point 504 may include a connecting member 504(A) connected to the shunt bus 506 and receiving members 504(B) configured to receive the conductor 510(C). The conductors 510 may connect to the receiving members 502(B) and 504(B) in various manners, such as through friction, an adhesive, soldering, brazing, welding, gluing, and so on.

The connection points 502 and 504 may be separate components that are insulated from each other through insulation 512. The insulation 512 may be non-conductive. As such, the connection point 502 may connect to a first side of the shunt element 508, while the connection point 504 separately connects to a second side of the shunt element 508.

Although FIGS. 5A and 5B illustrate the connection points 502 and 504 positioned on the shunt bus 506, in other examples the connection points 502 and 504 may be positioned on the shunt element 508. For example, the connecting member 504(A) may be located on the shunt element 508 on one side and the connecting member 502(A) may be located on the shunt element 508 on the other side.

In some instances, the distance between the half shear buttons 402(D) and 402(E), or connecting members 504(A) and 502(A), are held to a tight tolerance (e.g., within a particular amount) in order to avoid calibrating a temperature error correction. For example, the tolerance may be relatively tight (within a particular amount) when the half shear buttons 402(D) and 402(E) or connecting members 504(A) and 502(A) are located beyond a shunt element (e.g., not on the shunt element), rather than on the shunt element. However, in some instances when the half shear buttons 402(D) and 402(E) or connecting members 504(A) and 502(A) are located on the shunt element, this may affect the general calibration range, and so the tolerance (e.g., distance) may still be maintained to be relatively tight.

Further, although examples connection points are shown in FIGS. 4 and 5 with specific structural components, in some instances conductors may connect to any location on a shunt bus and/or shunt element. For example, conductors may be attached directly to a shunt bus via soldering, brazing, welding, an adhesive, a fastener, gluing, and so on. In such examples, a location where a conductor is attached to the shunt bus comprises a connection point.

Figure 6A:
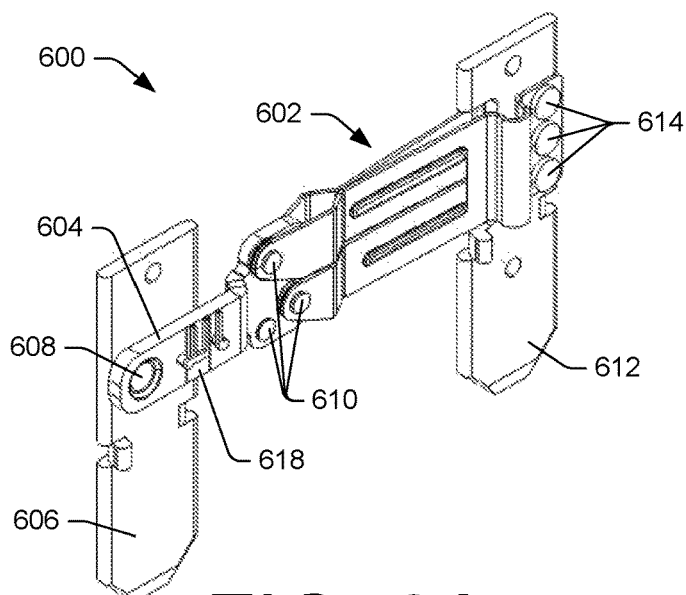
FIG. 6A illustrates a perspective view of an example shunt with a connecting element.
Figure 6B:
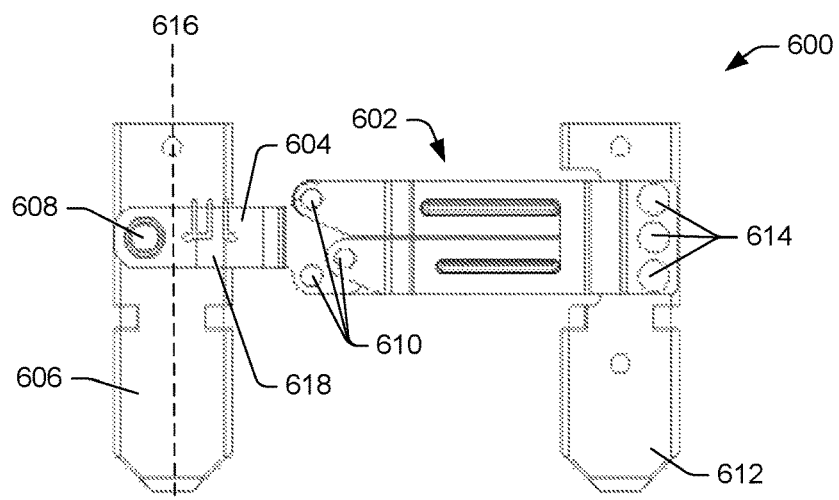
FIG. 6B illustrates a front view of an example shunt with a connecting element.
Figure 6C:
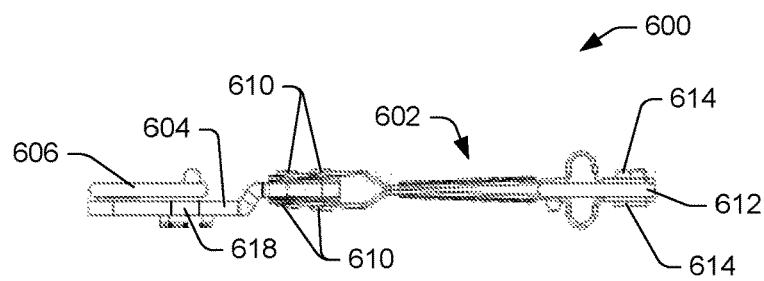
FIG. 6C illustrates a top view of an example shunt with a connecting element.

FIGS. 6A-6C shows an example shunt 600 with a connecting element 602. The shunt 600 includes a shunt bus 604 connected, at a first end of the shunt bus 604, to a first terminal 606 via a protrusion 608. The shunt bus 604 is also connected, at a second end of the shunt bus 604, to a first end of the connecting element 602 via fasteners 610, such as rivets, screws, etc. The connecting element 602 is connected, at a second end of the connecting element 602, to a second terminal 612 via fasteners 614, such as rivets, screws, etc. As such, the shunt bus 604 is electrically connected to the second terminal 612 via the connecting element 602. Although fasteners 610 and 614 are used in this example, the components may be connected in other manners, such as by soldering, welding, brazing, using an adhesive, gluing, etc.

In this example, the connecting element 602 comprises a switch configured to open or close a conductive path of the shunt 600. That is, the switch may open or close a conductive path between the shunt bus 604 and the second terminal 612. Here, current generally flows in through the first terminal 606, through the shunt bus 604, then through the connecting element 602, and out the second terminal 612. In one example, a switch may be implemented as that described in U.S. Pat. No. 8,395,464, which is incorporated herein by reference. In another example, other types of switches may be used. FIG. 6 shows the shunt 600 in a form in which the shunt 600 may generally be implemented (e.g., in a closed form where current can pass through the shunt 600). In other examples, other types of connecting elements may be used instead of the switch.

FIGS. 6A-6C illustrates that the shunt bus 604 being connected to the first terminal 606 in an offset manner. In other words, the shunt bus 604 is connected to the first terminal 606 at a side of the first terminal 606 (e.g., left side) that is farthest from the second terminal 612. Such side of the first terminal 606 is represented in FIG. 6B to the left of a center line 616. The shunt bus 604 is connected to a substantially planar surface of the first terminal 606. Further, as illustrated, the shunt bus 604 includes a shunt element 618 that is offset to one side of the shunt 600 (e.g., to the left). Here, the shunt element 618 is above a side of the first terminal 606 that is closest to the second terminal 612 (e.g., a side of the first terminal 606 to a right of the center line 616). By offsetting the shunt bus 604 and/or the shunt element 618 to the left, the connecting element 602 may be positioned between the first terminal 606 and the second terminal 612.

Although the shunt 600 is illustrated as being offset in FIGS. 6A-6C to the left, in other examples the shunt bus 604 and/or the shunt element 618 may be offset to the right. In such examples, the shunt bus 604 and the connecting element 602 may be swapped so that the shunt bus 604 connects directly to the second terminal 612 and the connecting element 602 connects directly to the first terminal 606.

Figure 7A:
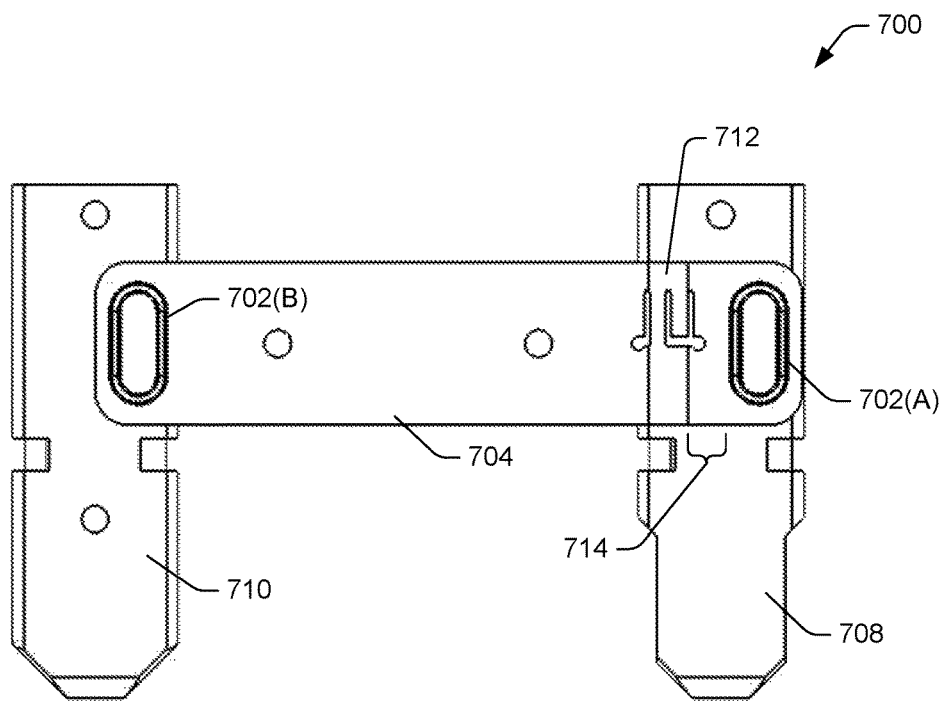
FIG. 7A illustrates a front view of an example shunt with oval-shaped conductive channels.
Figure 7B:
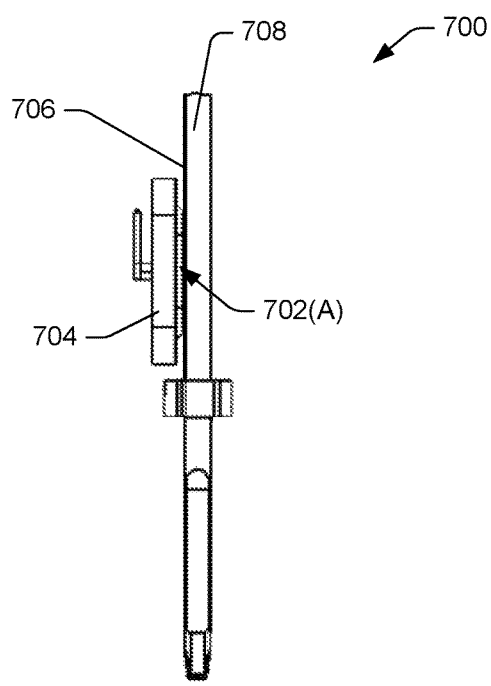
FIG. 7B illustrates a side view of an example shunt with oval-shaped conductive channels.

FIGS. 7A and 7B illustrates an example shunt 700 with oval-shaped conductive channels 702. FIG. 7A illustrates a front view of the shunt 700, while FIG. 7B illustrates a side view of the shunt 700. Here, the conductive channels 700 are protrusions that extend off a shunt bus 704. The shunt 700 may include a similar structure as the shunt 100 discussed above with respect to FIG. 1, except that the shunt 700 includes oval-shaped protrusions 702, instead of circle-shaped protrusions (the protrusions 108 and 110).

In this example, the shunt bus 704 is offset to the right. In particular, the shunt bus 704 is connected to a substantially planar surface 706 of a first terminal 708 at a side of the first terminal 708 that is farthest from a second terminal 710. Further, the shunt bus 704 is connected to the second terminal 710 on a side of the second terminal 710 that is closest to the first terminal 708. The shunt bus 704 may be connected to a substantially planar surface of the second terminal 710.

The shunt bus 704 includes a shunt element 712 positioned a distance 714 from the protrusion 702(A). The distance 714 may include a predetermined distance that is determined from analyzing current flow through the shunt 700, such as a distance that avoids non-uniform current flow through the shunt element 712. As such, the shunt element 712 may be disposed within a predetermined proximity to the protrusion 702(A). In this example, current generally flows in through the first terminal 708 and out the second terminal 710.

Figure 8:
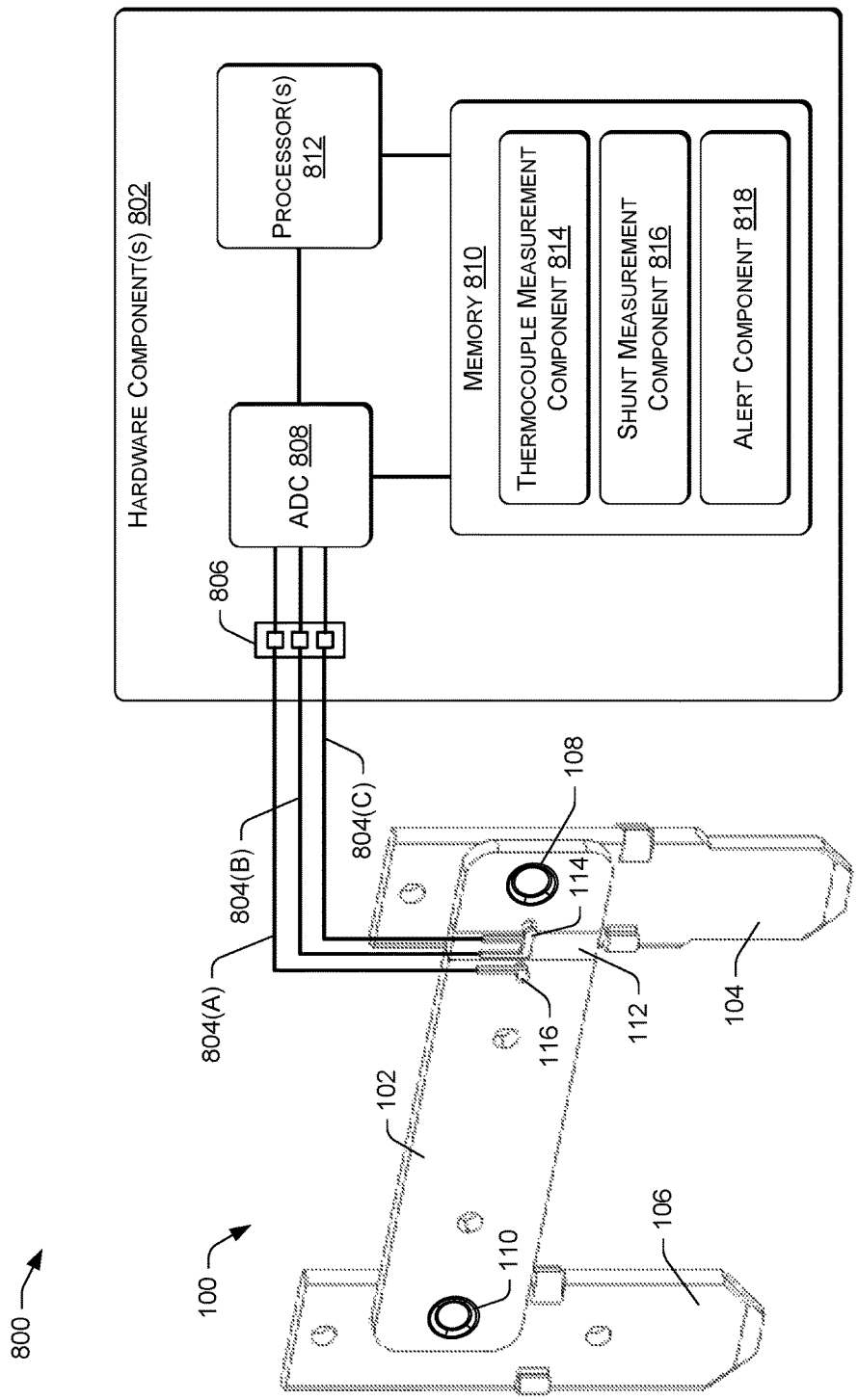
FIG. 8 illustrates an example thermocouple system.

FIG. 8 illustrates an example thermocouple system 800 (e.g., thermocouple device). The thermocouple system 800 is described in the context of implementing the shunt 100 of FIG. 1. However, the thermocouple system 800 may be implemented with other shunts.

The thermocouple system 800 may include one or more hardware components 802 electrically connected to the shunt 100 via conductors 804. The one or more hardware components 802 may be configured to receive signals from the shunt 100 via the conductors 804. The one or more hardware components 802 may include a connector 806 to interface the conductors 804 to the one or more hardware components 802. In the example of FIG. 8, the one or more hardware components 802 also include an Analog-to-Digital Converter (ADC) 808 that converts the signals of the conductors 804 from analog signals into digital signals. The digital and/or analog signals may be stored in memory 810 and/or sent to one or more processors 812. The one or more hardware components 802 may use the digital and/or analog signals to perform a variety of operations, as discussed herein. Although the connector 806 and ADC 808 are illustrated in FIG. 8, in some examples such elements may be eliminated. For ease of discussion, a reference to a signal from a conductor will refer to an analog and/or digital signal associated with the conductor. In many instances, the signals from the conductors 804 are relatively small (e.g., in the microvolt level). In such instances, an amplifier or other component is used to amplify the signals. In one example, an amplifier is included as part of the ADC 808. In another example, an amplifier is a separate component.

The conductors 804 may include a sensing conductor 804(A) electrically connected to the connection point 116, a reference conductor 804(B) (or 804(C)) electrically connected to the connection point 114, and a thermocouple conductor 804(C) (or 804(B)) electrically connected to the connection point 114. The thermocouple conductor 804(C) may be composed of a different material (e.g., conductive material) than the reference conductor 804(B). As one example, the thermocouple conductor 804(C) may be composed of constantan, while the reference conductor 804(B) may be composed of copper. Here, the thermocouple conductor 804(C) and the reference conductor 804(B) form a type-T thermocouple. In other examples, other types of conductive materials are used, creating different types of thermocouples, such as a type E thermocouple (chromel-constantan), type J thermocouple (iron-constantan), type M thermocouple, type N thermocouple, type B thermocouple, type R thermocouple, type S thermocouple, tungsten/rhenium-alloy thermocouple, type C thermocouple, type D thermocouple, type G thermocouple, chromel-gold/iron thermocouple, type P thermocouple (noble-metal), platinum/molybdenum-alloy thermocouple, iridium/rhodium alloy thermocouple, and so on. The thermocouple conductor 804(C) and the reference conductor 804(B) may be insulated from each other except at the sensing junction (the connection point 114) and another location within the one or more hardware components 802 (e.g., the opposite end). Thus, the reference conductor 804(B) and the thermocouple conductor 804(C) may create a thermocouple, since the two conductors are attached to the same connection point and/or are composed of different materials.

As noted above, the one or more hardware components 802 are implemented in the context of the one or more processors 812 and the memory 810. The one or more processors 812 may include a central processing unit (CPU), a graphics processing unit (GPU), a microprocessor, and so on. The memory 810 (as well as all other memory described herein) may comprise computer-readable media and may take the form of volatile memory, such as random access memory (RAM) and/or non-volatile memory, such as read only memory (ROM) or flash RAM. Computer-readable media includes volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include communication media, such as modulated data signals and carrier waves.

In the example of FIG. 8, the one or more hardware components 802 are implemented with a Printed Wiring Board (PWB) or Printed Circuit Board (PCB). In other examples, the one or more hardware components 802 may be implemented with other electric circuits and/or components.

As noted above, the one or more hardware components may be communicatively coupled to the conductors 804 to receive signals from the conductors 804. The one or more hardware components 802 may use the signals to facilitate various functionality. In this example, the memory 810 includes a thermocouple measurement component 814, a shunt measurement component 816, and an alert component 818 to facilitate such functionality. Here, the thermocouple measurement component 814, the shunt measurement component 816, and the alert component 818 are implemented as software modules that are executable by the one or more processors 812 that are communicatively coupled to the memory 810. Thus, the one or more processors 812 may execute the components 814-818 to perform the described operations. The term "module" is intended to represent example divisions of software for purposes of discussion, and is not intended to represent any type of requirement or required method, manner or necessary organization. Accordingly, while various "modules" are discussed, their functionality and/or similar functionality could be arranged differently (e.g., combined into a fewer number of modules, broken into a larger number of modules, etc.).

The thermocouple measurement component 814 may be configured to measure a temperature of the shunt 100. As noted above, in many instances a calculation of current through the shunt 100 may be affected by the temperature of the shunt 100 (e.g., due to temperature changes affecting the resistance of the shunt 100). The temperature of the shunt 100 may be affected by meter load (e.g., joule heating), ambient temperature (e.g., environment conditions, such as solar heating), and so on. Thus, the temperature of the shunt 100 may be measured to compensate for inaccuracies of the current measurement facilitated by the shunt measurement component 816.

To determine the temperature of the shunt 100, the thermocouple measurement component 814 may retrieve a signal of the reference conductor 804(B) and a signal of the thermocouple conductor 804(C). The signals may be retrieved from the memory 810 and/or directly from the shunt 100. Each of the signals may comprise a voltage signal, such as a Direct Current (DC) voltage signal or an Alternating Current (AC) voltage signal. The thermocouple measurement component 814 may compare the signal from the reference conductor 804(B) to the signal from the thermocouple conductor 804(C) to determine a difference in voltage between the two conductors. The thermocouple measurement component 814 may also determine a temperature at the one or more hardware components 802, such as by using a thermometer or another device located at the one or more hardware components 802. This temperature may represent the temperature of the thermocouple at the other end of the thermocouple (e.g., the end opposite the connection point 114). Then, based on the difference in voltage between the reference conductor 804(B) and the thermocouple conductor 804(C) and the temperature at the one or more hardware components 802, the thermocouple measurement component 814 may use a formula to determine the temperature of the shunt 100. The formula may have been formed when calibrating the thermocouple. The formula may account for the properties of the reference conductor 804(B) and the thermocouple conductor 804(C), such as the material composition of the conductors, the length/width of conductors, etc. The temperature of the shunt 100 represents the temperature at the connection point 114. The thermocouple measurement component 814 may generate temperature data indicating the temperature of the shunt 100 and store the temperature data in the memory 810 and/or provide the temperature data to the shunt measurement component 816 and/or the alert component 818.

The shunt measurement component 816 may be configured to measure an amount of current passing through the shunt 100. In particular, the shunt measurement component 814 may retrieve a signal of the reference conductor 804(B) and a signal of the sensing conductor 804(A). The signals may be retrieved from the memory 810 and/or directly from the shunt 100. Each of the signals may comprise a voltage signal, such as a DC voltage signal or an AC voltage signal. The shunt measurement component 814 may compare the signal of the reference conductor 804(B) to the signal of the sensing conductor 804(A) to determine a voltage drop across the shunt element 112 (e.g., a voltage difference between the two conductors). Then, based on the voltage drop, and knowing the resistance of the shunt element 112, the shunt measurement component 814 may determine the amount of current passing through the shunt element 112 based on Ohm's law. The shunt measurement component 816 may generate current data indicating the amount of current passing through the shunt element 112, store the current data in the memory 810, and/or provide the current data to other components.

In many instances, the shunt measurement component 816 may account for a temperature at the shunt 100. In particular, the shunt measurement component 816 may compensate for a change in resistance of the shunt 100 due to a temperature of the shunt 100. For example, the shunt measurement component 816 may reference a temperature curve or other criteria that specifies a relationship between temperature and current/resistance. The shunt measurement component 816 may use the temperature curve or other criteria to adjust the current data that is based on the voltage drop across the shunt element 112 (e.g., the voltage difference between the signal from the reference conductor 804(B) and the signal from the sensing conductor 804(A)).

As such, the thermocouple measurement component 814 and the shunt measurement component 816 may share a conductor. That is, the thermocouple measurement component 814 may use a signal from the reference conductor 804(B) to determine a temperature of the shunt, and the shunt measurement component 816 may use a signal from the reference conductor 804(B) to determine current passing through the shunt 100.

The alert component 818 may be configured to provide an alert regarding a temperature of a conductive path into which the shunt 100 is connected. For example, the alert component 818 may retrieve the temperature of the shunt 100 from the memory 810 and/or the thermocouple measurement component 814. The temperature of the shunt 100 may indicate (e.g., correspond to) the temperature of the conductive path into which the shunt 100 is connected (e.g., a meter socket). The alert component 818 may determine whether or not the temperature of the conductive path (e.g., a meter socket) is greater than a threshold. When the temperature is greater than the threshold, this indicates that the conductive path is overheating (e.g., a hot socket condition). In some instances, the conductive path may overheat when the shunt is being installed/replaced and/or when a socket includes loose jaws.

In any event, when the temperature of the conductive path is greater than the threshold, the alert component 818 may send an alert indicating that the temperature of the conductive path is greater than the threshold. The alert may be sent to a service provider computing device associated with a utility (e.g., a central office for the utility), a computing device associated with a technician (e.g., performing maintenance on the meter), a computing device associated with a customer employing the meter, etc. A party that receives the alert may disconnect the shunt 100, open a circuit path through the shunt 100 (e.g., flip a switch to stop current flow), and/or perform other actions. In some instances, the alert may be sent while a party is located at the shunt 100, such as while a technician is performing maintenance on a meter (e.g., changing out the meter).

Although the techniques discussed above include the alert component 818 sending an alert, in some instances the alert component 818 may send an instruction or otherwise cause an action to be automatically performed. For example, if the temperature of the conductive path is greater than a threshold, the alert component 818 may automatically interrupt (e.g., break) the conductive path through the shunt 100 (e.g., cause the switch to open the circuit).

Further, although the example of FIG. 8 illustrates the one or more hardware components 802 being implemented in the context of the one or more processors 812 and the memory 810, the one or more hardware components 802 may be implemented as other components. For instance, the one or more hardware components 802 may be implemented as one or more Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. As such, the operations that are described as being implemented by the thermocouple measurement component 814, the shunt measurement component 816, and/or the alert component 818 on the one or more processors 812, may be implemented in whole or in part by FPGAs, ASICs, ASSPs, SOCs, CPLDs, etc.

Further, the one or more hardware components 802 may additionally, or alternatively, include a network interface and a radio (not illustrated in FIG. 8). The network interface may communicate via a wired or wireless network. The alert component 818 may send alerts regarding temperature via the network interface and/or the radio. The radio may comprise an RF transceiver configured to transmit and/or receive RF signals via one or more of a plurality of channels/frequencies. The radio may be configured to communicate using a plurality of different modulation techniques, data rates, protocols, signal strengths, and/or power levels. The radio includes an antenna coupled to an RF front end and a baseband processor. The RF front end may provide transmitting and/or receiving functions. The RF front end may include high-frequency analog and/or hardware components that provide functionality, such as tuning and/or attenuating signals provided by the antenna. The RF front end may provide a signal to the baseband processor.

In one example, all or part of the baseband processor may be configured as a software (SW) defined radio. In one implementation, the baseband processor provides frequency and/or channel selection functionality to the radio. For example, the SW defined radio may include mixers, filters, amplifiers, modulators and/or demodulators, detectors, etc., implemented in software executed by a processor, ASIC, or other embedded computing device(s). The SW defined radio may utilize processor(s) and software defined and/or stored in the memory 810. Alternatively, or additionally, the radio may be implemented at least in part using analog components.

Moreover, the memory 810 may include other types of components. For example, the memory 810 may store a metrology component configured to collect consumption data of one or more resources (e.g., electricity, water, natural gas, etc.). The consumption data may include, for example, electricity consumption data, water consumption data, and/or natural gas consumption data. The consumption data may include data generated at a node where the shunt 100 is implemented (e.g., a meter), another node (e.g., another meter or utility node), or a combination thereof. The collected consumption data may be transmitted to a data collector in the case of a star network or, in the case of a mesh network, to one or more other nodes for eventual propagation to a service provider computing device associated with a utility or another destination.

Figure 9A:
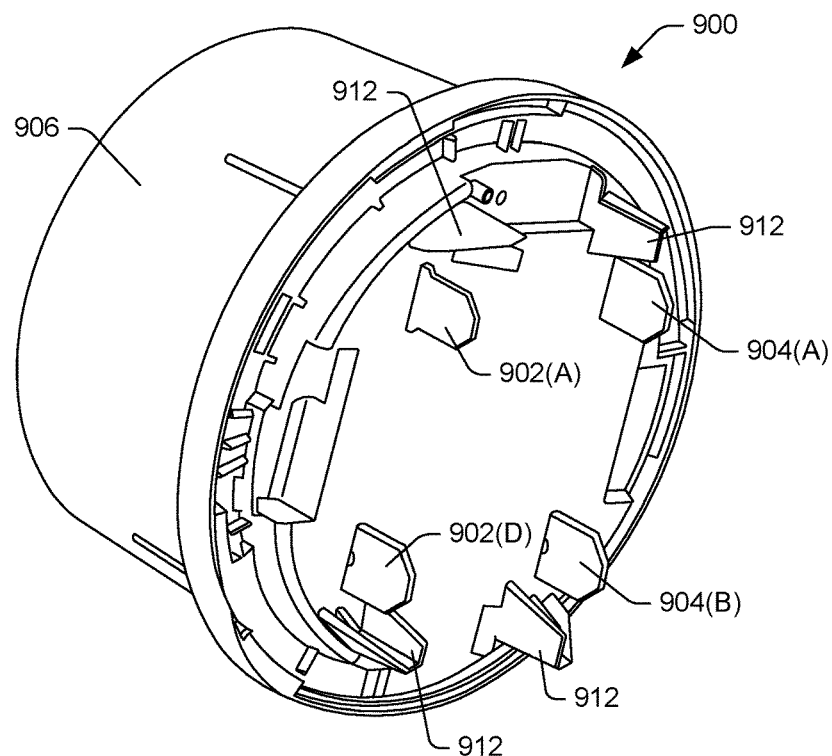
FIG. 9A illustrates a perspective view of an example meter with shunts located within the meter.
Figure 9B:
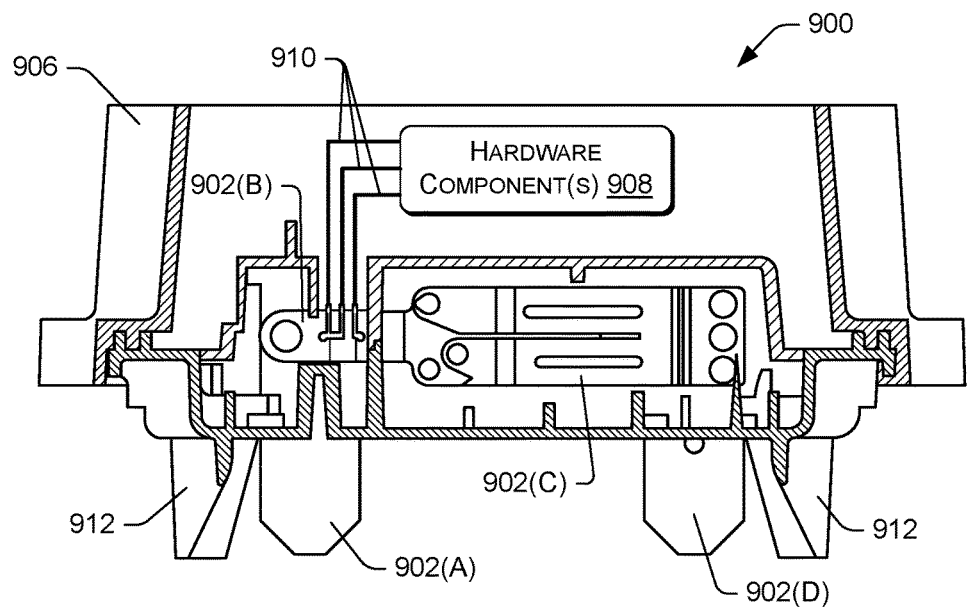
FIG. 9B illustrates a cross-sectional view of the example meter of FIG. 9A.

FIGS. 9A and 9B illustrate an example meter 900 with shunts 902 and 904 located within the meter 900. FIG. 9A shows a perspective view of a side of the meter 900 that attaches to a meter socket. In particular, the portions of the shunts 902 and 904 that are exposed in FIG. 9A may connect to the meter socket. In particular, terminals 902(A) and 902(D) of shunt 902 may connect to jaws of a socket (e.g., a conductive path) and terminals 904(A) and 904(B) of shunt 904 may connect to the jaws of the socket. Meanwhile, FIG. 9B shows a cross-sectional view of the meter 900 with the shunt 902.

The meter 900 includes a housing 906 that encloses at least a portion of the shunts 902 and 904, one or more hardware components 908, and conductors 910. As such, the housing may enclose a shunt and a thermocouple device. The housing 906 may also include tabs 912 that may be used to assist in connecting the meter 900 to the meter socket. The conductors 910 may connect the shunt 902 to the one or more hardware components 908. Although the shunt 904 is not shown in FIG. 9B, the shunt 904 may also be connected to the one or more hardware components 908. The conductors 910 may include a reference conductor, sensing conductor, and thermocouple conductor. As illustrated in FIG. 9B, the shunt 902 includes a terminal 902(A), a shunt bus 902(B), a switch 902(C), and another terminal 902(D). Current may flow in a left-to-right manner with respect to FIG. 9B.

Figure 10A:
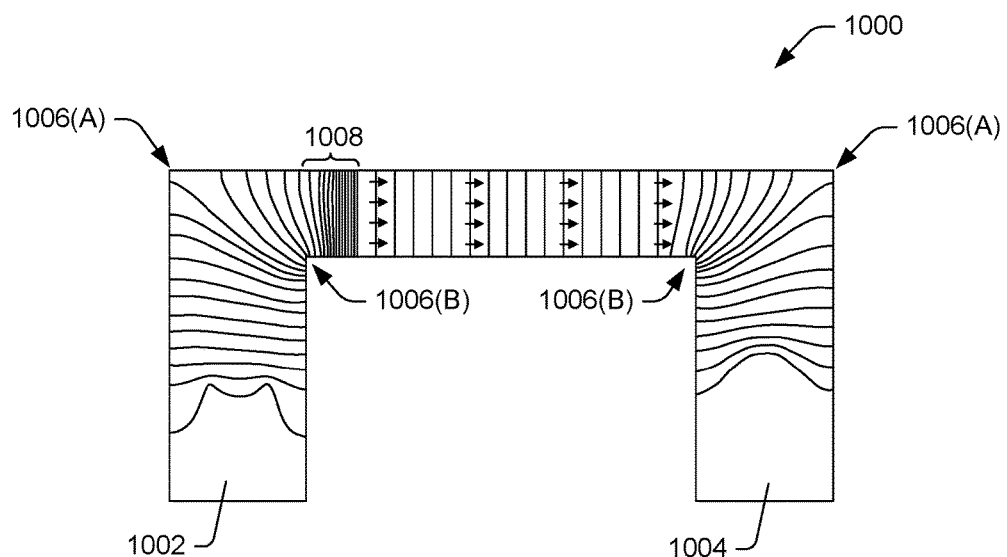
FIG. 10A illustrates current flow lines for a shunt in related art.

FIG. 10A illustrates current flow lines for a shunt in related art. Here, the shunt 1000 includes a single U-shaped piece that is upside down. Current may enter the shunt at an end 1002 and exit the shunt at an end 1004. The vertical and horizontal lines represent current flow lines of equipotential. As illustrated, the current flow lines at corners 1006 of the shunt 1000 are non-symmetrical and non-uniform due to the 90-degree bend in the shunt 1000. That is, the current flow lines are wider apart at outside edges 1006(A) in comparison to inner edges 1006(B) of the corners 1006 and/or the current flow lines are curved. This leads to inaccurate current measurements in a measurement region 1008, where the shunt element is located. As the shunt element is positioned closer to a corner, the inaccuracy of the current measurement may increase.

Figure 10B:
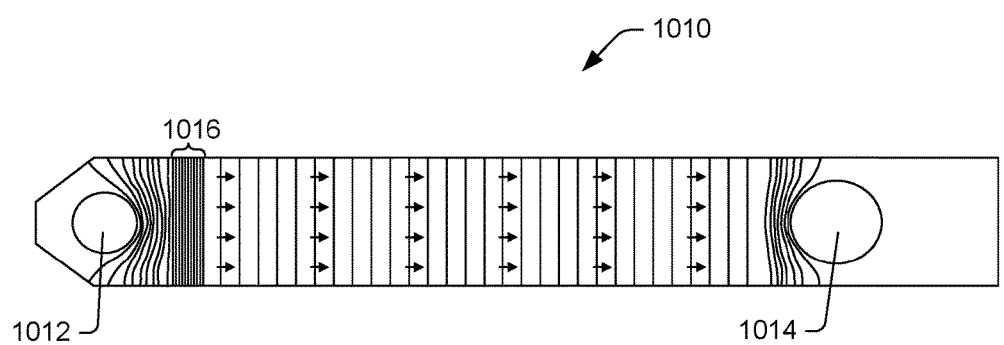
FIG. 10B illustrates current flow lines for an example shunt described herein.

FIG. 10B illustrates current flow lines for an example shunt 1010 described herein, such as the shunt 100 of FIG. 1. For ease of illustration, the shunt 1010 is represented as a shunt bus without terminals. As such, the shunt 1010 will be referred to as the shunt bus 1010. Here, current may enter the shunt bus 1010 at a conductive channel 1012 and exit the shunt bus 1010 at a conductive channel 1014. The vertical lines represent current flow lines of equipotential. As illustrated, due at least in part to the conductive channel 1012, the current flow lines are uniform and symmetrical at a measurement region 1016, where a shunt element is located. This leads to accurate current measurements for the shunt 1010

Figure 11:
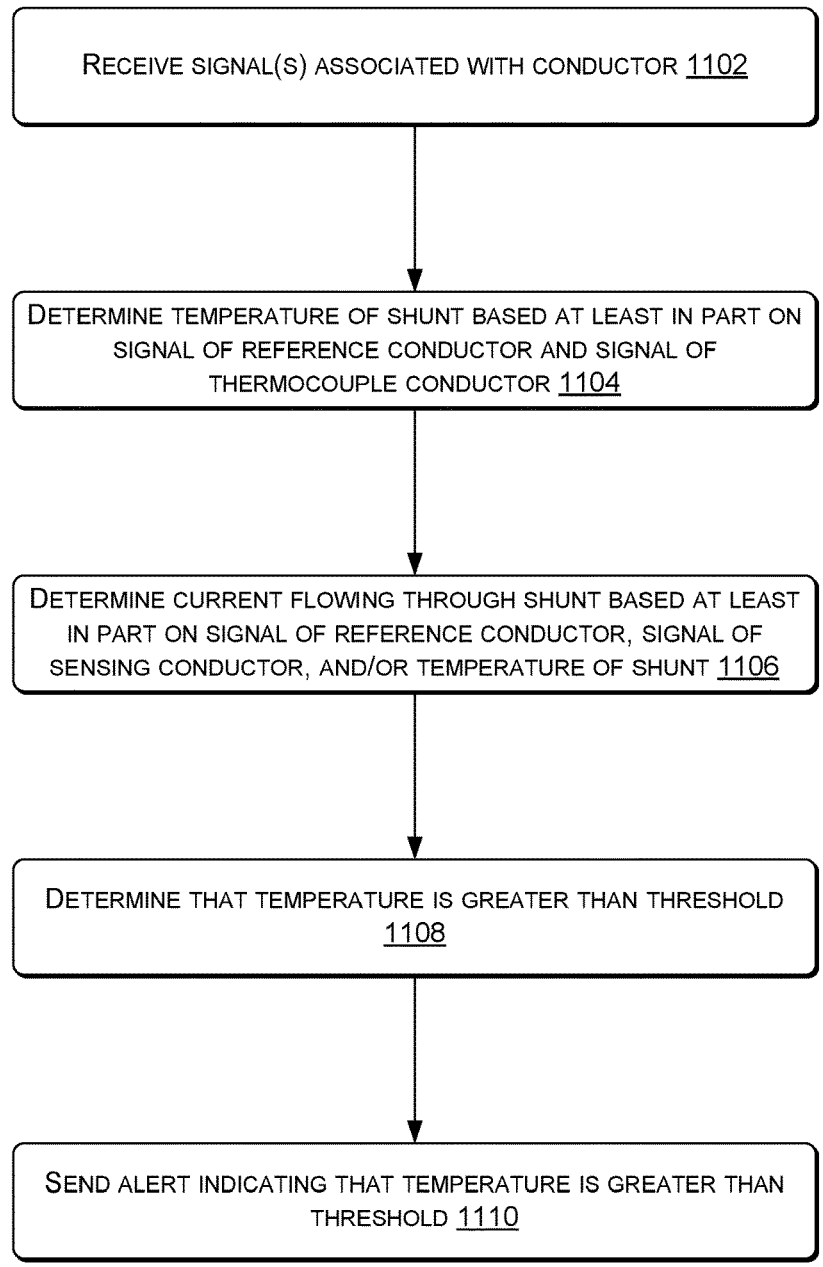
FIG. 11 illustrates an example process for employing techniques described herein.

FIG. 11 illustrates an example process 1100 for employing the techniques described herein. In particular, the process 1100 is implemented to determine temperature of a shunt, determine current flowing through the shunt, and send an alert regarding temperature of the shunt. For ease of illustration, the process 1100 is described as being performed in the context of FIG. 8. For example, one or more of the individual operations of the process 1100 may be performed by the one or more hardware components 802. However, the process 1100 may be performed in other contexts.

The process 1100 (as well as each process described herein) are illustrated as a logical flow graph, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process. Further, any number of the individual operations may be omitted.

At 1102, the one or more hardware components 802 may receive signals associated with conductors that are connected to a shunt. For example, the conductors may include a reference conductor, a sensing conductor, and a thermocouple conductor.

At 1104, the one or more hardware components 802 may determine a temperature of the shunt based at least in part on a signal of the reference conductor and a signal of the thermocouple conductor.

At 1106, the one or more hardware components 802 may determine an amount of current flowing through the shunt based at least in part on a signal of the reference conductor and a signal of the sensing conductor. The one or more hardware components 802 may also use a temperature of the shunt to compensate for inaccuracies due to temperature. In some instances, the compensation is applied after an initial current measurement is determined. In other instances, the initial determination of the amount of current accounts for the temperature of the shunt.

At 1108, the one or more hardware components 802 may determine that a temperature of a conductive path into which the shunt is connected is greater than a threshold. That is, the one or more hardware components 802 may determine that the temperature of the shunt is greater than the threshold.

At 1110, the one or more hardware components 802 may send an alert indicating that the temperature is greater than the threshold. The alert may be sent to any entity, such as a customer, service provider computing device at a utility, a technician, and so on.

CONCLUSION

Although embodiments have been described in language specific to structural features and/or methodological acts, it is to be understood that the disclosure is not necessarily limited to the specific features or acts described. Rather, the specific features and acts are disclosed herein as illustrative forms of implementing the embodiments.

What is claimed is:

1. A meter comprising:
   a housing enclosing at least a portion of a shunt and at least a portion of one or more hardware components;
   the shunt including a shunt bus and a shunt element disposed along the shunt bus, the shunt having a first connection point located along the shunt bus on a first side of the shunt element and a second connection point located along the shunt bus on a second side of the shunt element;
   a reference conductor attached to the shunt bus at the first connection point;
   a sensing conductor attached to the shunt bus at the second connection point;
   a thermocouple conductor attached to the shunt bus at the first connection point to create a thermocouple with the reference conductor, the thermocouple conductor comprising a different material than the reference conductor; and
   the one or more hardware components communicatively coupled to at least one of the reference conductor, the sensing conductor, or the thermocouple conductor, the one or more hardware components being configured to:
      determine a temperature of the shunt based at least in part on a signal from the reference conductor and a signal from the thermocouple conductor; and
      determine an amount of current passing through the shunt element based at least in part on the signal from the reference conductor, a signal from the sensing conductor, and the temperature of the shunt.

2. The meter of claim 1, wherein the one or more hardware components are further configured to:
   based at least in part on the temperature of the shunt, determine that a temperature of a socket into which the shunt is connected is greater than a threshold; and
   send an alert indicating that the temperature of the socket is greater than the threshold.

3. The meter of claim 2, wherein the one or more hardware components are configured to send the alert to at least one of a service provider computing device associated with a utility, a computing device associated with a technician, or a computing device associated with a customer employing the meter.

4. The meter of claim 1, wherein the signal from the reference conductor, the signal from the sensing conductor, and the signal from the thermocouple conductor each comprise a voltage signal.

5. The meter of claim 1, wherein the one or more hardware components are configured to determine the amount of current passing through the shunt element by:
  based at least in part on the signal from the reference conductor and the signal from the sensing conductor, determining current data indicating an amount of current passing through the shunt element; and
  compensating for a change in resistance of the shunt element due to the temperature of the shunt, the compensating including adjusting the current data based at least in part on the temperature of the shunt.

6. A system comprising:
  a first conductor attached to a shunt at a first connection point located on a first side of a shunt element, the shunt including the shunt element;
  a second conductor electrically connected to a second connection point located on a second side of the shunt element;
  a third conductor attached to the shunt at the first connection point, the third conductor comprising a different material than the first conductor; and
  one or more hardware components configured to:
    determine a temperature of the shunt element based at least in part on a signal from the first conductor and a signal from the third conductor; and
    determine an amount of current passing through the shunt element based at least in part on the signal from the first conductor, a signal from the second conductor, and the temperature of the shunt element.

7. The meter of claim 1, wherein the first connection point is disposed on the shunt bus on the first side of the shunt element and the second connection point is disposed on the shunt bus on the second side of the shunt element.

8. The system of claim 6, further comprising:
  a shunt bus that includes the shunt element, the first connection point being disposed on the shunt bus on the first side of the shunt element and the second connection point being disposed on the shunt bus on the second side of the shunt element.

9. The system of claim 8, wherein a path of current through the shunt element defines a direction and at least one of the first connection point or the second connection point is positioned in substantially a center of the shunt bus along an axis that is perpendicular to the direction.

10. The system of claim 6, wherein the one or more hardware components are configured to:
  based at least in part on the temperature of the shunt element, determine that a temperature of a conductive path into which the shunt is connected is greater than a threshold; and
  send an alert indicating that the temperature of the conductive path is greater than the threshold.

11. The system of claim 10, wherein the one or more hardware components are configured to send the alert to at least one of a service provider computing device associated with a utility, a computing device associated with a technician, or a computing device associated with a customer.

12. The system of claim 6, wherein the one or more hardware components are configured to determine the amount of current passing through the shunt element by:
  based at least in part on the signal from the first conductor and the signal from the second conductor, determining current data indicating an amount of current passing through the shunt element; and
  adjusting the current data based at least in part on the temperature of the shunt element.

13. The system of claim 6, wherein the one or more hardware components are configured to determine the temperature of the shunt element based at least in part on a comparison of the signal from the first conductor to the signal from the third conductor.

14. A thermocouple device comprising:
  a reference conductor directly connected to a first point of a shunt;
  a sensing conductor electrically connected to a second point of the shunt;
  a thermocouple conductor directly connected to the first point of the shunt to create a thermocouple with the reference conductor, the thermocouple conductor comprising a different material than the reference conductor;
  a thermocouple measurement component configured to provide temperature data regarding the shunt to a shunt measurement component based at least in part on a signal from the reference conductor and a signal from the thermocouple conductor; and
  the shunt measurement component configured to determine an amount of current passing through the shunt based at least in part on the signal from the reference conductor, a signal from the sensing conductor, and the temperature data.

15. The thermocouple device of claim 14, further comprising:
  an alert component communicatively coupled to the thermocouple measurement component and configured to, based at least in part on the temperature data, determine that a temperature of a conductive path into which the shunt is connected is greater than a threshold.

16. The thermocouple device of claim 15, wherein the alert component is configured to send an alert indicating that the temperature of the conductive path is greater than the threshold, the alert being sent to at least one of a service provider computing device associated with a utility, a computing device associated with a technician, or a computing device associated with a customer.

17. The thermocouple device of claim 15, wherein the alert component is configured to, based at least in part on determining that the temperature of the conductive path is greater than the threshold, cause the conductive path to be interrupted.

18. The thermocouple device of claim 14, wherein the shunt measurement component is configured to determine the amount of current passing through the shunt by:
  based at least in part on the signal from the reference conductor and the signal from the sensing conductor, determining current data indicating an amount of current passing through the shunt; and
  updating the current data based at least in part on the temperature data.

19. The thermocouple device of claim 14, wherein the signal from the reference conductor, the signal from the sensing conductor, and the signal from the thermocouple conductor each comprise a voltage signal.

20. The thermocouple of claim 14, wherein:
  the shunt includes a shunt bus and a shunt element disposed along the shunt bus; and
  the first point is located on the shunt bus on a first side of the shunt element and the second point is located on the shunt bus on a second side of the shunt element.

* * * * *